US011923132B2

(12) United States Patent
Herzog et al.

(10) Patent No.: US 11,923,132 B2
(45) Date of Patent: Mar. 5, 2024

(54) SOLENOIDAL MAGNET SECTION WITH INTEGRATED JOINTS, IN PARTICULAR HTS-LTS JOINTS, AND ASSOCIATED MAGNET COIL ASSEMBLY

(71) Applicant: Bruker Switzerland AG, Faellanden (CH)

(72) Inventors: Robert Herzog, Zürich (CH); Patrik Vonlanthen, Schwerzenbach (CH)

( * ) Notice: Subject to any disclaimer, the term of this patent is extended or adjusted under 35 U.S.C. 154(b) by 888 days.

(21) Appl. No.: 16/943,695

(22) Filed: Jul. 30, 2020

(65) Prior Publication Data

US 2021/0035722 A1    Feb. 4, 2021

(30) Foreign Application Priority Data

Jul. 31, 2019   (DE) .................... 10 2019 211 478.4

(51) Int. Cl.
    *H01F 6/06*    (2006.01)
    *H01F 27/32*    (2006.01)
    *H01F 41/04*    (2006.01)

(52) U.S. Cl.
    CPC .............. *H01F 6/06* (2013.01); *H01F 27/324* (2013.01); *H01F 41/048* (2013.01)

(58) Field of Classification Search
CPC ......... H01F 6/06; H01F 41/048; H01F 27/324
See application file for complete search history.

(56) References Cited

U.S. PATENT DOCUMENTS

| 3,559,128 A | 1/1971 | Kingston et al. |
| 6,753,748 B1 | 6/2004 | Schlenga |
| 6,774,752 B2 | 8/2004 | Schlenga et al. |
| 7,215,230 B2 | 5/2007 | Niemann et al. |
| 7,781,376 B2 | 8/2010 | Kodenkandath et al. |

(Continued)

FOREIGN PATENT DOCUMENTS

| CA | 2210540 A1 | 1/1998 |
| CA | 2707225 A1 | 12/2010 |

(Continued)

OTHER PUBLICATIONS

Do Carmo, M., "Differential Geometry of Curves and Surfaces", Prentice-Hall, Englewood Cliffs, New Jersey, 1976, p. 308.

(Continued)

*Primary Examiner* — Paul A Wartalowicz
(74) *Attorney, Agent, or Firm* — Benoît & Côté Inc.

(57) ABSTRACT

A solenoidal magnet section has a high-temperature-superconductor tape wound in a solenoidal manner in a main winding chamber of a coil former. Two joints, each from the HTS tape to a follow-on superconductor, are integrated in the magnet section. The terminal sections of the HTS tape and the associated follow-on superconductor are each wound onto the coil former and connected to one another in a laminar manner. The regions of the first and second joint are axially offset from each other and the main winding chamber. The magnet section occupies a radial range with limits less than 20% larger than the outer radius of the main HTS winding package and less than 20% smaller than the inner radius of the coil former in the region of the main winding chamber. A plurality of magnet sections can be inserted one inside the other to form a magnet coil assembly.

26 Claims, 8 Drawing Sheets

(56) References Cited

U.S. PATENT DOCUMENTS

| 8,255,022 B2 | 8/2012 | Schneider et al. |
| 8,712,489 B2 | 4/2014 | Schauwecker et al. |
| 10,241,168 B2 | 3/2019 | Roth et al. |
| 2009/0140831 A1 | 6/2009 | Remke et al. |
| 2012/0242339 A1* | 9/2012 | Rey ................... G01R 33/28 |
| | | 324/322 |
| 2014/0100116 A1* | 4/2014 | Schlenga ............ H02H 9/023 |
| | | 505/211 |
| 2016/0216032 A1* | 7/2016 | Colgan ................ F27D 3/0084 |
| 2020/0075207 A1 | 3/2020 | Maeda et al. |

FOREIGN PATENT DOCUMENTS

| CN | 101192463 A | 6/2008 |
| CN | 101512829 A | 8/2009 |
| DE | 2240281 A1 | 3/1973 |
| DE | 10202372 B4 | 8/2003 |
| DE | 10225531 A1 | 1/2004 |
| DE | 10260728 B4 | 5/2005 |
| DE | 102011082652 A1 | 3/2013 |
| DE | 102013220142 A1 | 4/2015 |
| EP | 2645382 A1 | 10/2013 |
| GB | 2388909 A | 11/2003 |
| WO | 2007107239 A1 | 9/2007 |

OTHER PUBLICATIONS

Michael, Philip C. et al., "Assembly and Test of a 3-Nested-Coil 800-MHz REBCO Insert (H800) for the MIT 1.3 GHz LTS/HTS NMT Magnet" IEEE Transactions on Applied Superconductivity, vol. 29, No. 5, Aug. 2019.

* cited by examiner

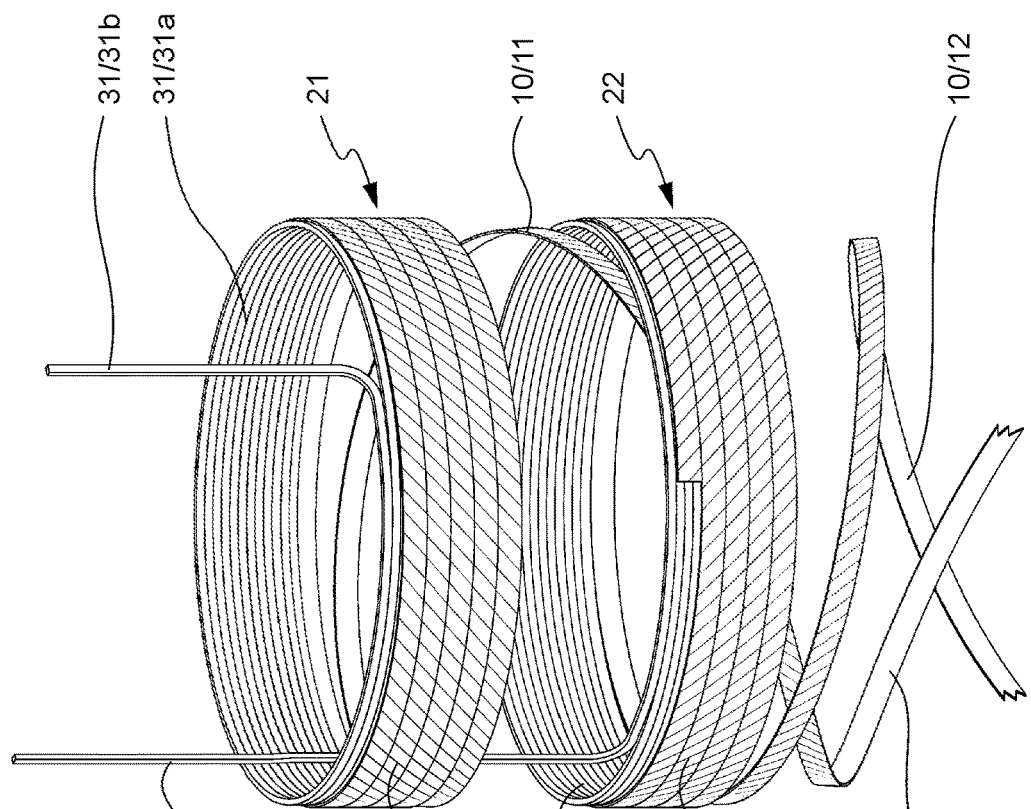
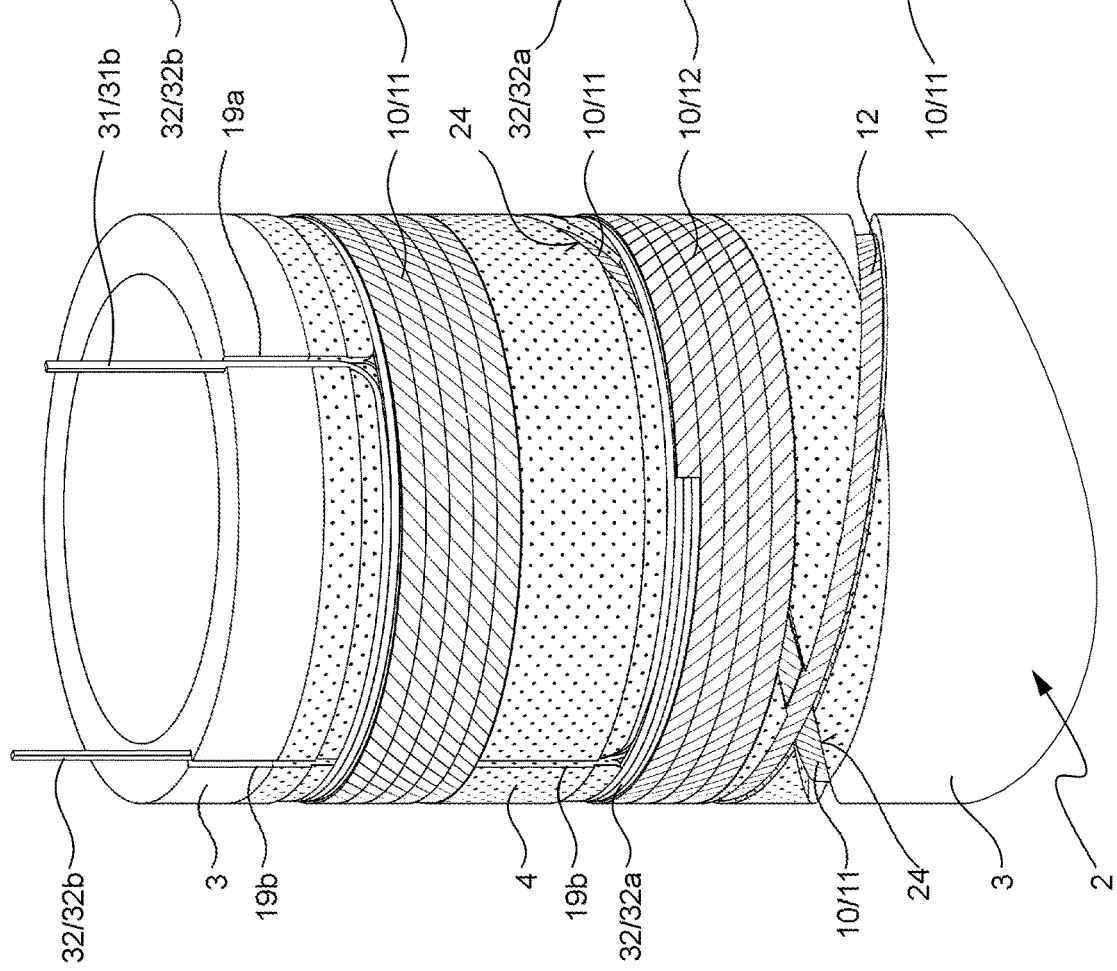
Fig. 2b
Fig. 2a

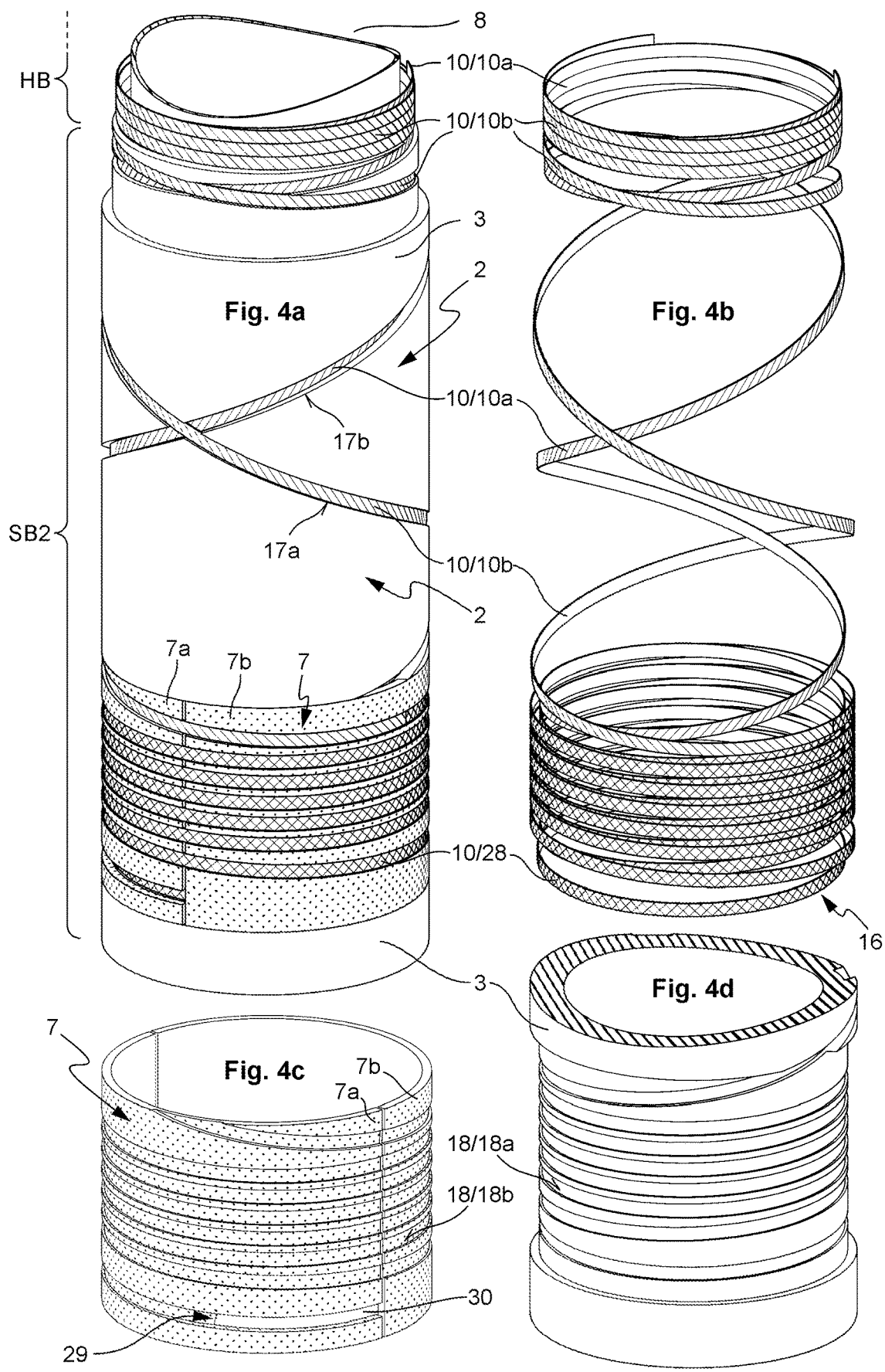

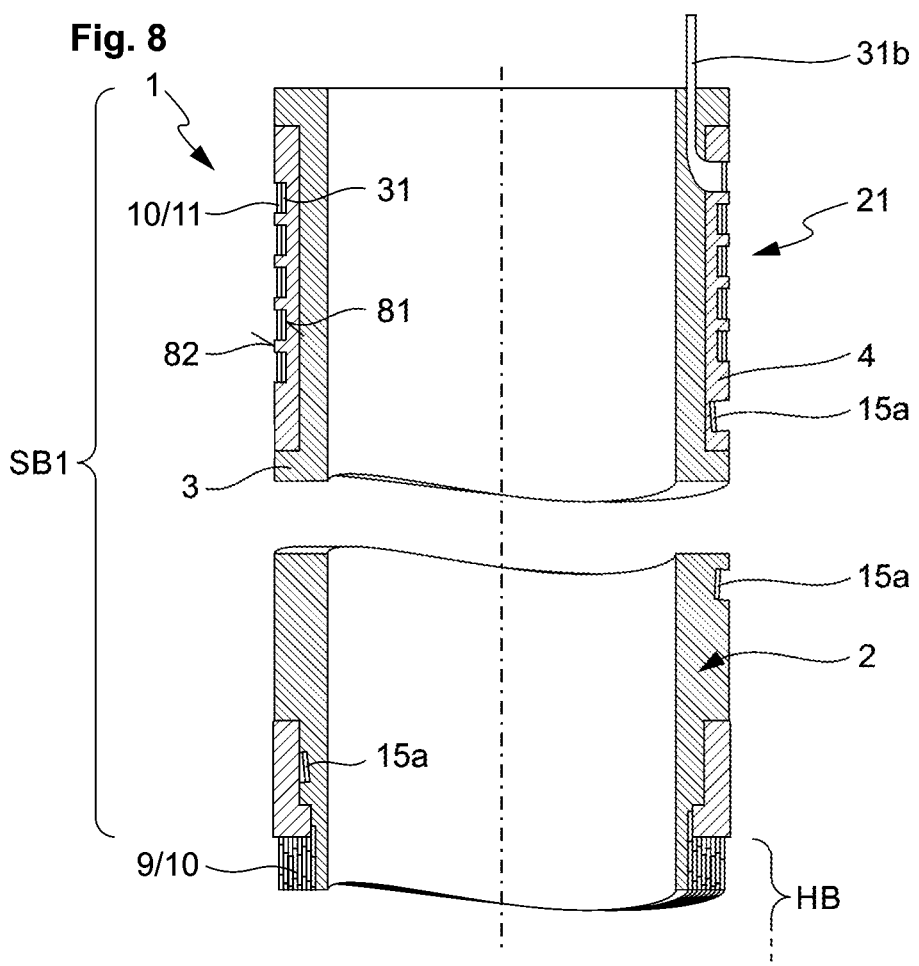

SOLENOIDAL MAGNET SECTION WITH INTEGRATED JOINTS, IN PARTICULAR HTS-LTS JOINTS, AND ASSOCIATED MAGNET COIL ASSEMBLY

BACKGROUND OF THE INVENTION

Field of the Invention

The invention relates to a solenoidal magnet section comprising an essentially hollow-cylindrical coil former, on which is wound a high-temperature-superconductor tape (HTS tape). Such a solenoidal magnet section has become known from DE 102 02 372 B4.

Description of the Related Art

Superconductors can carry electrical current with practically no resistive losses below their critical temperature. Superconductors are used in particular in solenoidal magnets to generate high magnetic fields, for example such as are required in NMR spectroscopy.

Particularly high superconducting current carrying capacities can be put to use using so-called high-temperature-superconductor material (HTS material), for example based on YBCO. However, HTS materials are generally brittle, and so in the design of magnets they are mostly used as a coating on a flexible substrate ("tape"). The HTS coating is very sensitive, and so the tape should not be bent about its short side if possible.

Low-temperature-superconductor materials (LTS materials) are usually metal materials, and they can be used in a variety of geometries. NbTi is also a good ductile LTS material.

In an important application for generating high magnetic fields, HTS tapes are wound onto an essentially hollow-cylindrical coil former in order to produce a solenoidal magnet section. One difficulty here is the design of inputs and outputs of the HTS tape or the establishment of electrical connections ("joints") to follow-on superconductors, for example connections to a NbTi wire, which is easier to handle.

U.S. Pat. No. 3,559,128 describes, in its FIG. 2, how to intersect and electrically connect a superconducting tape wound onto a coil former to a superconducting strip guided along the axis of the coil former at the boundary of the winding pack. However, it is disadvantageous here that the joint lies in a region of high magnetic field and also of high mechanical forces, and therefore the superconducting current carrying capacity of the coil is severely limited.

U.S. Pat. No. 3,559,128 also describes, in its FIG. 4, how to gently twist the tape, which is wound onto a coil former, at the boundary of the winding pack and to guide it through an opening in the flange of a coil former. A similar procedure is proposed in DE 102 60 728 B4. Here, the HTS tape is twisted from the edge of the winding along a predetermined path and guided axially outward so that the HTS tape is not bent about its short edge. A joint to a follow-on superconductor is made so as to be axially distanced from the winding, and thus in a region of reduced magnetic field. However, in this procedure the HTS tape is unfavorably oriented due to its being twisted at the edge of the winding in a region which still possesses a high magnetic field, namely high magnetic field components perpendicular to the plane of the tape, and this limits the current carrying capacity. In addition, the course of the HTS tape lying parallel to the coil axis is unfavorable for the purposes of contacting a follow-on superconductor in a space-saving manner.

EP 2 645 382 describes a solenoidally wound coil with a layer joint, successive segments of an HTS tape being conductively connected to one another over a certain length within a winding package. The joint is located in a region of high magnetic field and therefore limits the current carrying capacity. In addition, the homogeneity of the magnetic field can be adversely affected.

DE 10 2013 220 142 A1 describes a magnet coil assembly with an inner HTS coil section and an outer LTS coil section. The HTS tape and the LTS wire are guided axially out of their coil sections in a manner not explained in detail, and are connected to one another in an electrically normally conductive manner over at least 5 m, and the connecting section is wound up. This structure is comparatively space consuming.

DE 102 02 372 B4 mentioned at the outset describes a solenoidal magnet section in which an HTS tape is wound onto a coil former in a solenoidal manner. In a sideward region, the winding density decreases axially outward, and at one axial end of the coil former the HTS tape is finally guided radially away from the coil former so that a joint can be formed in a region of low magnetic field. A groove for guiding the HTS tape is formed in the coil former. This structure is also very space consuming.

From Manfredo P. do Carmo, Differential Geometry of Curves and Surfaces, Prentice-Hall, Englewood Cliffs, New Jersey 1976, p. 308, the concept of an envelope of the family of rectifying planes of a parameterized space curve is explained.

SUMMARY OF THE INVENTION

In accordance with the present invention, a solenoidal magnet section is provided that has an essentially hollow-cylindrical coil former on which is wound a high-temperature-superconductor tape (HTS tape), and a first follow-on superconductor with a first joint between the HTS tape and the first follow-on superconductor. The coil former has a main region in which a main winding package of the HTS tape is wound in a solenoidal manner onto the coil former. The coil former further has a first lateral region which axially adjoins the main region on a first side and in which a first terminal section of the HTS tape is wound onto the coil former. The first terminal section of the HTS tape is guided in a groove on the surface of the coil former at least in an axially inner section of the first lateral region, and the main winding package of the HTS tape has a largest outer radius RaH, while the coil former having a smallest inner radius RiH in the main region.

The problem addressed by the invention is that of providing a solenoidal magnet section with a high current carrying capacity and with provisions for electrical connections to the HTS tape within a compact space.

This problem is solved according to the invention by a solenoidal magnet section of the type mentioned at the outset, which is characterized in that the solenoidal magnet section further comprises a second follow-on superconductor with a second joint to the HTS tape, in that in the first lateral region or in a second lateral region which axially adjoins the main region on a second side and lies opposite to the first side, a second terminal section of the HTS tape is wound onto the coil former, in that at least in an axially inner section of the first or the second lateral region, the second terminal section of the HTS tape is guided in a groove on the surface of the coil former, in that in an axially outer section of the first lateral region at least a part of the first terminal section of the HTS tape wound onto the coil former is connected in a laminar manner to a terminal section of the first follow-on superconductor to form the first joint, and at least a part of the second terminal section of the HTS tape wound onto the coil former is connected in a laminar manner to a terminal section of the second follow-on superconductor to form the second joint, and in that the coil former as a whole, the HTS tape as a whole, and the first follow-on superconductor, at least in the region of the first joint and the second follow-on superconductor, at least in the region of the second joint, run within a radial range RBS of the solenoidal magnet section, where $0.80*RiH \leq RBS \leq 1.2*RaH$, preferably $0.9*RiH \leq RBS \leq 1.1*RaH$, particularly preferably $RiH \leq RBS \leq RaH$.

The invention provides for the forming of the first joint and the second joint which electrically connect, in particular superconductively, the HTS tape to a first follow-on superconductor and a second follow-on superconductor, in each case in an axially outer section of a lateral region of the coil former, by interconnecting the first and the second terminal section of the HTS tape with terminal sections of the first and the second follow-on superconductor in an overlapping and laminar manner, the HTS tape and the first and the second follow-on superconductor being wound onto the coil former in the region of the first and the second joint.

The HTS tape is first guided from the main region, in which the main winding package generates the strongest magnetic field, axially further outward via an axially inner section of the lateral region, a groove guiding the HTS tape and stabilizing it mechanically. In the axially outer section of the lateral region there is a significantly lower magnetic field and correspondingly also smaller Lorentz forces, so that the first and the second joint can be formed here without negatively influencing the current carrying capacity or mechanical stability. The first and the second joint are typically axially distanced from the main winding package (measured edge to edge) by at least 1.5 times the maximum outer radius RaH of the main winding package.

Since the winding of the HTS tape, from the main region along the axially inner section to the axially outer section and the joint, is essentially simply further wound onto the coil former (albeit at least predominantly with a longer pitch length than in the main winding package in order to minimize inhomogeneities in the magnetic field), and in particular since no twisting of the HTS tape is necessary, the construction according to the invention is mechanically robust and the HTS tape is generally also favorably oriented toward the generated magnetic field with regard to the current carrying capacity as well. This also contributes to a high current carrying capacity.

By winding the first and the second joint onto the coil former, comparatively large overlap areas (or overlap lengths) can be established in a compact space, as a result of which the electrical connection can be established reliably and without noticeable resistive losses. The laminar (electrically conductive) connection of the HTS tape and the follow-on superconductor can be achieved by soldering, for example; the connection is preferably superconducting.

Due to the fact that the essential structure of the solenoidal magnet section is limited to the radial range RBS, i.e. up to a maximum deviation of 20% (preferably a maximum of 10%, particularly preferably completely) within the radius interval pre-defined by the smallest inner radius RiH of the coil former in the main region and the largest outer radius RaH of the main winding package, a high effective superconducting current density can be achieved. In addition, solenoidal magnet sections according to the invention may be easily inserted in sequence in order to generate high magnetic fields overall. HTS tapes available only in limited lengths (for example, currently approximately 300 m) can also be efficiently installed in a solenoidal magnet section according to the invention, only comparatively small total radial wall thicknesses of the solenoidal magnet section being required for this purpose. A particularly large number of solenoidal magnet sections can then be inserted one inside the other in a small space.

The grooves which run at least in the axially inner section of the first and/or the second lateral region typically run in a helical manner with variable pitch and (slightly) variable radius. The grooves (and optionally joint grooves, connection grooves and grooves for the intermediate joint, see below) guide the HTS tape with very little play (for example with a play in the transverse direction of $\leq \frac{1}{10}$ of the tape width); the HTS tape is supported individually at each turn.

The grooves (and optionally joint grooves, connection grooves and grooves for the intermediate joint, see below) are preferably designed in such a way that the guiding of the HTS tape entails no bending about the short side, or at least minimal bending (i.e. without any "hard bending", or a minimum amount thereof). It should be noted that with a given (but selectable) groove course defined by a center line of the groove, there is exactly one associated developable surface, the so-called envelope of the rectifying planes (see Manfredo P. do Carmo, Differential Geometry of Curves and Surfaces, Prentice-Hall, Englewood Cliffs, New Jersey 1976, p. 308), which fulfills this condition.

Typically, the first follow-on superconductor has a lower critical temperature than the HTS tape, and the second follow-on superconductor has a lower critical temperature than the HTS tape. In particular, the first follow-on superconductor and the second follow-on superconductor may be of the same type (in particular made of the same superconducting material). The follow-on superconductors are typically metal, ductile and therefore easy to handle; typically the follow-on superconductor wire is a NbTi wire. The further (external) electrical connection of the solenoidal magnet section can be achieved using the follow-on superconductors.

Within the scope of the invention, it is also possible to first connect (in each case) the HTS tape and the follow-on superconductor at the first and/or the second joint ("joint") in a laminar manner, and then in turn to connect the follow-on superconductor to a third superconductor ("third superconductor joint") in a laminar manner, and in turn to wind the follow-on superconductor and the third superconductor onto the coil former in the lateral region in the axially outer section. Overall, a so-called "bridge joint" can be created by the joint and the third superconductor joint, the follow-on superconductor serving as so-called bridge tape. The third superconductor is then guided out of the solenoidal magnet section for further electrical connection; what has been said for the follow-on superconductor also applies to this third superconductor accordingly.

Embodiments of the Design of the First and the Second Joint

In an exemplary embodiment of the solenoidal magnet section according to the invention, the first joint and the second joint each extend over the entire circumference of the coil former, and/or the first joint and the second joint each extend over an overlap length, relative to the HTS tape, of at least 0.1 m, preferably at least 0.5 m. Within the scope of the invention, large overlap areas or overlap lengths can easily be established. As a result, the first and the second joint can be formed particularly reliably with a high current carrying capacity and virtually negligible resistive losses. Typically, the first and the second joint, each with a plurality of turns, for example at least 3 turns or at least 5 turns, extend around the coil former, both with respect to the HTS tape and with respect to the follow-on superconductor. Note that the number of turns of the HTS tape and the follow-on superconductor can be different, especially when using a joint winding chamber.

An embodiment is also provided in which in the main region the coil former has a circumferential recess as the main winding chamber, in which recess the main winding package of the HTS tape is layer-wound into a solenoid. The main winding chamber is easy to set up and can axially enclose the turns of the HTS tape and thereby stabilize it mechanically. Preferably, the upper (radially outer) edge of the recess of the main winding chamber in the coil former is essentially (for example at a maximum deviation of 10%, based on RaH) aligned with the top (radial outside) of the main winding package so that the result is an essentially continuous outer side of the solenoidal magnet section.

Another embodiment provides that in the axially outer section of the first lateral region, the coil former has a circumferential recess as a first joint winding chamber in which at least the part of the first terminal section of the HTS tape with a plurality of adjacent turns and the terminal section of the first follow-on superconductor with a plurality of adjacent turns are wound so as to lie one above the other, and/or that in the axially outer section of the first or the second lateral region, the coil former has a circumferential recess as a second joint winding chamber in which at least the part of the second terminal section of the HTS tape with a plurality of adjacent turns and the terminal section of the second follow-on superconductor with a plurality of adjacent turns are wound so as to lie one above the other. A circumferential recess as the first or the second joint winding chamber is easy to set up and can axially enclose the joint and thereby mechanically stabilize it. Typically, the first and the second follow-on superconductor are each arranged on the inside radially and the HTS tape is arranged on the outside radially, the HTS tape being oriented in such a way that its HTS layer points inward, that is to say toward the follow-on superconductor. Typically, the follow-on superconductors are still less wide than the HTS tape so that there are more turns of the follow-on superconductor than turns of the HTS tape in the connection region (overlap region).

In an advantageous development, the coil former is made of an electrically insulating material, in particular a plastics material, in the region of the walls of the first joint winding chamber and/or of the walls of the second joint winding chamber. In the region of the joint winding chamber, this can be achieved by producing the coil former with a plastics tube or with polymer shells integrated into the otherwise metal coil former (main body) during manufacture of the coil former, for example. The electrical insulation of the winding chamber prevents short-circuit currents between the conductors and the metal coil former and currents therethrough between the joints.

Another advantageous embodiment provides that the coil former has a first joint groove in the axially outer section of the first lateral region, which groove passes at least once, preferably several times, around the coil former and in which at least the part of the first terminal section of the HTS tape and the terminal section of the first follow-on superconductor are guided so as to lie one above the other, and/or that in the axially outer section of the first or the second lateral region, the coil former has a second joint groove which passes at least once, preferably several times, around the coil former, in which groove at least the part of the second terminal section of the HTS tape and the terminal section of the second follow-on superconductor are guided so as to lie one above the other. The joint groove enables the HTS tape and the follow-on superconductor to be guided very precisely, for example in order to minimize the mechanical stress caused by forces (in particular Lorenz forces) and/or to optimize the alignment with regard to the current carrying capacity. In the particular joint groove, "one" HTS tape and "one" follow-on superconductor run together around the coil former; the joint groove is typically helical.

A further preferred development of this embodiment is one in which the coil former is made of an electrically insulating material, in particular a plastics material, in the region of the walls of the first joint groove and/or of the walls of the second joint groove. As a result, short-circuit loops in the region of the particular joint can be avoided.

Embodiments with a First and a Second Joint on One Side

An embodiment is also provided in which the second terminal section of the HTS tape is also wound onto the coil former in the first lateral region, in particular the grooves of the first terminal section and of the second terminal section intersecting multiple times in the axially inner section of the first lateral region.

A particularly compact design can be achieved by forming the first and the second joint in the first lateral region, i.e. on the same (axial) side of the main region or of the main winding chamber, because the axially inner section of the first lateral region can then be used for arranging both the first joint and the second joint within the low magnetic field at a distance from the main region. In addition, external electrical connections (using the follow-on superconductor) may be concentrated on one side, which facilitates access in a cryostat from only one side (from above, for example); access from only one side is the norm with vertical magnet designs. By allowing intersections, the guidance of the HTS tape is considerably simplified; in particular, too rapid a change in the pitch of the (helical) windings of the HTS tape away from the main region can be avoided, and thus bending of the HTS tape about the short side can be minimized or completely eliminated. As an alternative to this embodiment, the first terminal section and the second terminal section of the HTS tape can also be wound onto different lateral regions.

One version of this embodiment provides that in a transition region of the axially inner section of the first lateral region axially adjoining the main winding chamber, the coil former is formed with a set of support shells which sit on the rest of the coil former and together annularly surround the rest of the coil former, and that in the transition region one of the grooves for the first terminal section and the second terminal section of the HTS tape is formed in the set of support shells, and the other of the grooves for the first terminal section and the second terminal section of the HTS tape is formed in the rest of the coil former radially below the set of support shells, the first and the second terminal section of the HTS tape intersecting at least once in the transition region. The main winding package usually comprises at least 4 winding layers, often also at least 10 or at least 40 winding layers, so that there is a considerable radius difference between the terminal sections of the HTS tape at the entrance and exit of the main winding package. The terminal section of the HTS tape in the radially outer groove may rest in a mechanically stable manner on the support shells even if the other terminal section of the HTS tape runs radially much further inward in the (rest of the) coil former (main body) and must be crossed (overlapped) over a considerable portion of the circumference of the coil former, for example at least half the circumference, at a small pitch length. Typically, the radius of the radially inner groove in the rest of the coil former increases axially outward in the transition region in order to guide the associated terminal section of the HTS tape to the outside of the coil former. Typically, two support shells ("half shells") are used as a set.

In another development, in the axially inner section of the first lateral region, the grooves for the first terminal section and the second terminal section of the HTS tape are formed with a different groove depth in at least one groove intersection. By establishing these intersections, greater freedom can be obtained in the guiding of the two terminal sections of the HTS tape, in particular in order to minimize mechanical stresses, for example bending about the short side. The difference in the groove depth preferably corresponds to at least the height of the HTS tape so that the terminal sections of the HTS tape are stably guided past one another in the intersection.

In one variation, the axially outer section of the first lateral region, a groove for the terminal section of the HTS tape connecting to the joint lying axially further outside runs radially inside the joint lying axially further inside. This structure is simple and takes advantage of the installation space available in the coil former.

A development is likewise provided in which, in the axially outer section of the first lateral region, an exit groove for the follow-on superconductor which is part of the joint lying axially further inside runs radially inside the joint lying axially further outside. This structure is again simple and takes advantage of the installation space available in the coil former.

Embodiments with an Intermediate Joint, in Particular a Bottom-Joint

Also provided is an embodiment of a solenoidal magnet section according to the invention in which the HTS tape has at least two HTS tape segments which are serially connected to one another conductively via at least one intermediate joint, the HTS tape segments being wound onto the coil former in the region of the at least one intermediate joint in the first lateral region or in the second lateral region, the HTS tape segments in particular being connected to a common superconducting (sc) bridge tape in the region of the at least one intermediate joint. Using the HTS tape segments, the total usable length of HTS tape in the solenoidal magnet section may be increased compared to the available length of HTS tape pieces (manufacturable with no errors). The intermediate joint preferably forms an HTS-HTS joint; however, it is also possible to arrange the intermediate joint axially sufficiently far from the main winding package, so that, for example, a sc bridge tape made of LTS material can also be used.

Another development of this embodiment provides that the coil former contains two connection grooves for the HTS tape segments in the first lateral region or in the second lateral region, which connection grooves lead from the main winding chamber to the region of the at least one intermediate joint, and the coil former contains an intermediate-joint groove for the HTS tape segments in the region of the intermediate joint. In the connection grooves and the intermediate-joint groove, the HTS tape can be supported and guided at each individual turn, in particular with a view to minimizing bending about the short side of the HTS tape and producing a favorable orientation relative to the magnetic field.

It is also provided that in the region of the at least one intermediate joint the coil former is equipped with a set of detachable half-shells which sit on the main coil former and together annularly surround the main coil former, and that a radially outer part of the groove for the intermediate joint is formed in the set of detachable half-shells, and a radially inner part of the groove for the intermediate joint is formed radially below the set of detachable half-shells in the main coil former, the set of detachable half-shells in particular having a region for the radial transition of the intermediate joint. By means of the detachable half-shells, it is possible to form the groove for the intermediate joint with two layers lying one above the other, so that the intermediate joint can be wound in the axial direction forward and back again in the same axial region. Typically, two detachable half-shells are used as a set. The set of detachable half-shells can particularly comprise a transition slot for the radial transition of the HTS tape segments of the intermediate joint.

Another development provides that the second terminal section of the HTS tape is also wound onto the coil former in the first lateral region, and the HTS tape segments in the region of the at least one intermediate joint are wound onto the coil former in the second lateral region, the cylindrical axis of the coil former in particular being aligned vertically with the second lateral region of the coil former at the bottom and the first lateral region at the top. This design simplifies the guidance of the HTS tape. The design is also very compact.

Various Embodiments

In an advantageous embodiment it is provided that
the grooves in which the HTS tape is guided at least in the axially inner section of the first and/or the second lateral region,
and optionally joint grooves in which the first and/or the second terminal section of the HTS tape are guided in the axially outer section of the first and/or the second lateral region,
and optionally connection grooves and intermediate-joint grooves for segments of the HTS tape which are connected to an intermediate joint are formed at least in part with a groove bottom on which the HTS tape rests and the local surface normal of which is at an angle other than 90° relative to the axis of the coil former. This design (with "tilted groove bottom") can minimize an angle between the local direction of the magnetic field generated by the main winding package (or an overall magnetic field generated by a magnet coil assembly, to which the solenoidal magnet section belongs) and the local tape plane of the HTS tape, thereby improving the superconducting current carrying capacity. In addition, the design of the groove bottom can allow the HTS tape to be guided in such a way that the bending about the short side ("hard bending") is minimized or eliminated.

Also provided is an embodiment that provides that the first follow-on superconductor and/or the second follow-on superconductor contain a low-temperature-superconductor material (LTS material), in particular NbTi, and/or that the first follow-on superconductor and/or the second follow-on superconductor contain $MgB_2$, and/or that the HTS tape contains ReBCO, in particular YBCO, or Bi2223. These designs have proven themselves in practice; associated conductor materials are commercially available. Re stands for a rare-earth element. A typical width of the HTS tape is 2.5-10 mm, usually 4 mm. The HTS tape usually has a (flexible) substrate made of stainless steel or Hastelloy. The follow-on superconductors are typically designed as a ductile wire, preferably with a rectangular wire cross section. The HTS materials typically have a critical temperature above 40 K. The LTS materials typically have a critical temperature below 30 K.

Another advantageous embodiment is one in which in the first lateral region the HTS tape of the first terminal section and in the first or the second lateral region the HTS tape of the second terminal section are each helically wound, with a pitch length that initially increases axially outward and then decreases again. The initially increasing pitch length simplifies minimizing the bending about the short side of the HTS tape. The fact that the pitch length decreases again facilitates the transition to the region of the first and the second joint wound onto the coil former, which again simplifies minimizing bending along the short side of the HTS tape. The long pitch length in the central region permits the minimization of the total length of HTS tape between the main winding chamber and the joint, also to improve the homogeneity of the magnetic field in the sample volume.

An embodiment is provided in which a connecting section of the first follow-on superconductor and the second follow-on superconductor leads in each case axially away from the axially outer section of the first or the second lateral region. This enables a further space-saving electrical connection, in particular in the case of magnet coil assemblies inserted one inside the other.

Magnet Coil Assemblies with Solenoidal Magnet Sections Inserted One Inside the Other The scope of the present invention also includes a magnet coil assembly comprising a plurality of solenoidal magnet sections according to the invention as described above, the solenoidal magnet sections being arranged so as to be inserted in sequence, the following applying in particular to a gap width MS of a particular radial gap between adjacent solenoidal magnet sections, averaged over the entire circumference: MS≤1 mm, preferably MS≤0.5 mm. Typically, even for a largest gap width GSB of a particular radial gap that occurs over the entire circumference between adjacent solenoidal magnet sections, GSB≤1 mm, preferably GSB≤0.6 mm, particularly preferably GSB≤0.45 mm. The arrangement of the solenoidal magnet section so as to be inserted one inside the other enables a large absolute magnetic field to be achieved in a sample volume within the innermost solenoidal magnet section. By designing the solenoidal magnet sections with a small gap width between the solenoidal magnet sections, a high effective superconducting current density (engineering current density) can be achieved.

In an advantageous embodiment of the magnet coil assembly according to the invention, the main winding package of a particular radially inner solenoidal magnet section rests radially outward against an inside of the coil former of the radially next outer solenoidal magnet section, or a particular radial gap between adjacent solenoidal magnet sections is filled with an impregnation material, the impregnation material in particular being electrically insulating, and the impregnation material in particular comprising a cured casting material and/or films. Mutual mechanical stabilization ("corseting structure") may be achieved through the mutual direct radial contact and/or the filling of the radial gap. Mutual radial mechanical support (directly or by filling the gap) prevents superconductor damage and inhomogeneities in the magnetic field generated in the sample volume are minimized. If the corseting effect of the mutual radial support is utilized, comparatively thin HTS tapes can also be used which themselves have a rather low mechanical strength (in particular tensile strength), but with which a higher effective current density can be achieved. Alternatively or additionally, the main winding package and/or further regions of the HTS tape can be wrapped with a corset tape or corset wire.

An embodiment is also provided in which the solenoidal magnet sections are formed with an identical axial length of the coil former and the lengths of the coil formers axially align. This achieves a structure which is compact in the axial direction and easy to handle, and can be accommodated easily in a cryostat.

In one embodiment, the solenoidal magnet sections are conductively connected to one another via their first follow-on superconductors and second follow-on superconductors. Typically, the coil sections are electrically connected together in series. An electrical, in particular superconducting, connection is easily possible via the follow-on superconductor, it being possible for this connection to be placed in the low-field region. If the magnet coil assembly comprises further solenoidal magnet sections (in addition to the solenoidal magnet sections with integrated joints described above), these are typically included in the electrical series circuit. Alternatively, it is also possible to operate individual or multiple coil sections separately, for example a radially outermost solenoidal magnet section used for active magnetic field shielding.

Also advantageous is an embodiment in which the magnet coil assembly is designed to generate a magnetic field with a strength B0 and a homogeneity of 100 ppm or better in a sample volume of at least 0.5 $cm^3$ inside the innermost solenoidal magnet section, and the first joints and the second joints, and also optionally the intermediate joint(s), of the solenoidal magnet sections are axially distanced far enough from the sample volume that the following applies for the largest magnitude of the magnetic field Bjoint at each of these joints: Bjoint≤½*B0, preferably Bjoint≤$\frac{1}{10}$*B0, particularly preferably Bjoint≤$\frac{1}{50}$*B0, in particular B0≥20 T. The low magnetic field Bjoint can be easily established within the scope of the invention by means of the axial distancing relative to the main winding package. Due to the low magnetic field Bjoint, a high current carrying capacity of the particular joint can be achieved, preferably such that the particular joint does not limit the superconducting current carrying capacity of the magnet coil assembly as a whole.

Also provided is an embodiment of a magnet coil assembly according to the invention, at least one of the solenoidal magnet sections being formed with a tilted groove bottom (see above), the magnet coil assembly providing that the solenoidal magnet sections are electrically connected in series, and that the local surface normal of the groove bottom runs in such a way that:

bending about the short edge of the HTS tape lying on the groove bottom is so small that elongation of the HTS tape never exceeds 0.6% at its edges, preferably never exceeds 0.2%, particularly preferably that no bending about the short edge of the HTS tape lying on the groove bottom takes place, and at the same time a local normal component of a magnetic field generated overall by the magnet coil assembly, which component is parallel to the local surface normal of the groove bottom, is smaller than or equal in magnitude overall to a reference normal component of the magnetic field, which reference normal component is the maximum of all components normal to the local tape surfaces of the HTS tape at the axially outermost turns of the main winding package. In other words, the groove bottom is guided and aligned in such a way that the maximum local normal component MNK of the magnetic field at the groove bottom is less than or equal to the reference normal component RNK which occurs in the main winding package (at its axial edge) in any case. In this case, the normal component along the groove bottom does not limit the overall current carrying capacity of the magnet coil assembly. Typically, a tilted groove bottom is provided in all solenoidal magnet sections of the magnet coil assembly, and MNK≤RNK applies.

Further advantages of the invention will become apparent from the description and the drawings. According to the invention, the above-mentioned features and those described below can each be used in isolation or together in any combination. The embodiments shown and described are not to be interpreted as an exhaustive list but rather have exemplary character for the description of the invention.

BRIEF DESCRIPTION OF THE DRAWINGS

FIG. 2a shows a schematic perspective view of the solenoidal magnet section of FIG. 1, in the upper, first lateral region in the region of the first and the second joint of the solenoidal magnet section.

FIG. 2b shows the schematic perspective view of FIG. 2a, without the coil former.

FIG. 4a shows a schematic perspective view of the solenoidal magnet section from FIG. 1 in the second, lower lateral region in the region of the lower axial end of the main winding package up to the intermediate joint.

FIG. 4b shows the perspective view of FIG. 4a, but only the HTS tape segments.

FIG. 4c shows the perspective view of FIG. 4a, but only the set of detachable half-shells.

FIG. 4d shows the perspective view of FIG. 4a, but only the coil former without detachable half-shells in the region of the intermediate joint.

FIG. 8 shows a highly schematic longitudinal section through a further embodiment of a solenoidal magnet section according to the invention, limited to the first lateral region, with a joint groove for the first joint in the first lateral region.

DETAILED DESCRIPTION

Figure 1:
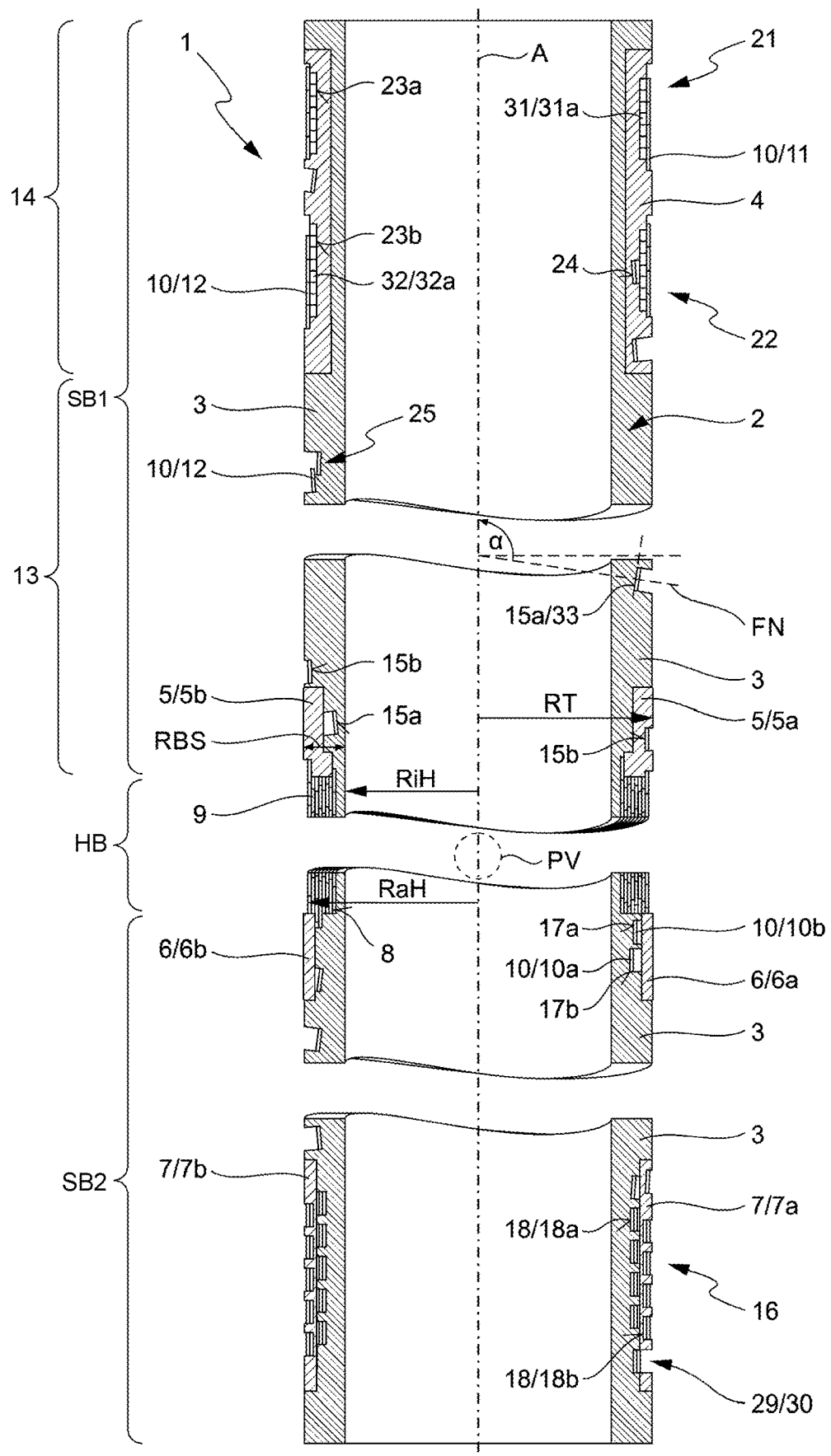
FIG. 1 shows a schematic longitudinal section through an embodiment of the solenoidal magnet section according to the invention, with the first and the second joint in the upper, first lateral region and an intermediate joint in the lower, second lateral region.
Figures 3A, 3B:
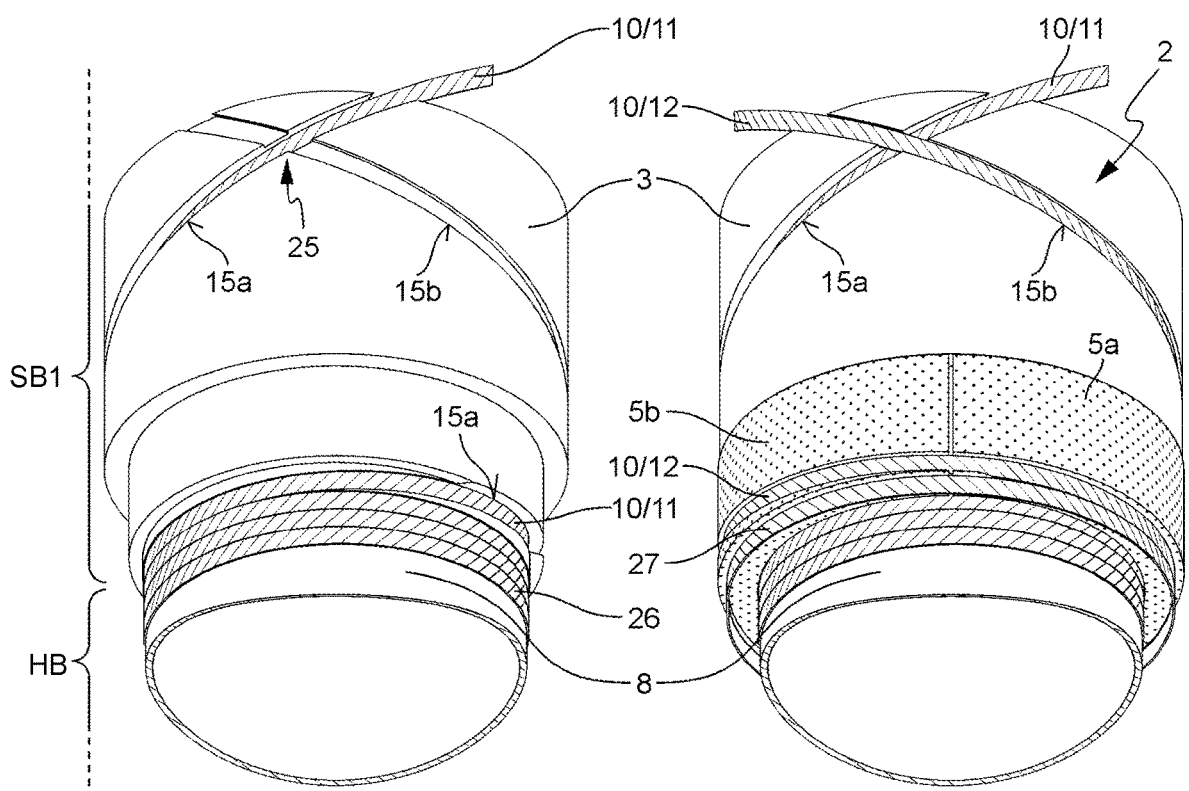
FIG. 3a shows a schematic perspective view of the solenoidal magnet section of FIG. 1 in the transition region from the upper end of the main winding package to the lower (axially inner) part of the first lateral region, with the main body and the first terminal section of the HTS tape and without the set of support shells.
FIG. 3b shows the perspective view of FIG. 3a, with the main body and the first terminal section and the second terminal section of the HTS tape and the set of support shells.
Figures 3C, 3D:
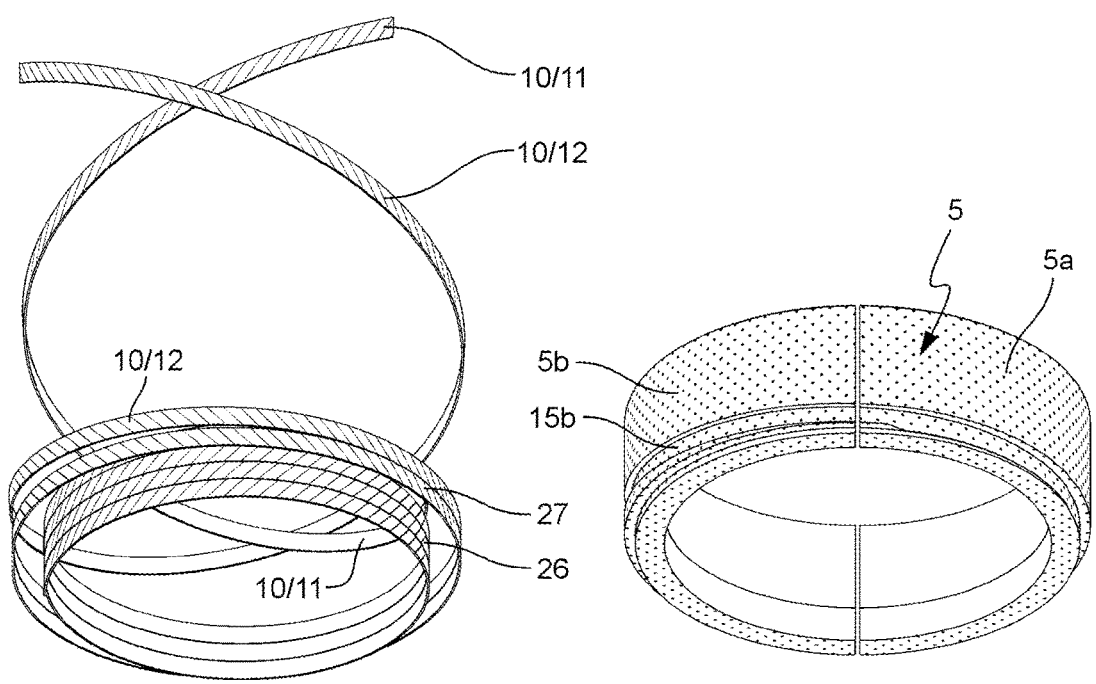
FIG. 3c shows the perspective view of FIG. 3a, with only the two terminal sections of the HTS tape.
FIG. 3d shows the perspective view of FIG. 3a, with only the set of detachable half-shells.

FIG. 1 shows, in a schematic longitudinal view, an embodiment of a solenoidal magnet section 1 according to the invention. The solenoidal magnet section 1 has a coil former 2, which overall is constructed essentially in the form of a hollow cylinder, see for example the axis (cylinder axis) A of the coil former 2, and for the most part with a tubular main body 3, here made of steel. In addition, the coil former 2 has an insulating member 4, a set 5 of support shells 5a, 5b, a set 6 of flange half shells 6a, 6b and a set 7 of detachable half-shells 7a, 7b, which are seated on the main body 3.

Furthermore, the magnet coil assembly 1 has an HTS tape 10, which here is formed in two parts with a first HTS tape segment 10a and a second HTS tape segment 10b. Here, the HTS tape 10 is made of a YBCO layer on a flexible metal substrate, in this case steel. In addition, the solenoidal magnet section 1 has two follow-on superconductors 31, 32. The two follow-on superconductors 31, 32 are designed here as NbTi wires.

The HTS tape 10 has a first terminal section 11 which is connected to a terminal section 31a of the first follow-on superconductor 31 in the region of a first joint 21. Furthermore, the HTS tape 10 has a second terminal section 12 which is connected to a terminal section 32a of the second follow-on superconductor 32 in the region of a second joint 22.

The solenoidal magnet section 1 is shown partially interrupted in the schematic illustration (see wave-shaped cuts) in order to better illustrate the essential aspects of the invention. In a main winding chamber 8 located in an axially centered main region HB of the coil former 2, most of the HTS tape 10 is layer-wound into a solenoid in a plurality of layers, in this case eight layers, to form a main winding package 9. Note that the axial length of the main winding chamber 8 is shown greatly shortened in FIG. 1. When electrical current flows through the HTS tape 10, a magnetic field is generated in a sample volume PV inside the solenoidal magnet section 1 (this field is typically increased by the field of further solenoidal magnet sections), and this field may be used for NMR measurements, for example.

The main region HB is adjoined axially at the top by a first lateral region SB1, the two joints 21, 22 also being formed in this region. In an axially inner section 13, the terminal sections 11, 12 of the HTS tape 10 are transferred from the joints 21, 22 to the main region HB in grooves 15a, 15b, which run in a helical manner. The joints 21, 22 are formed in an outer axial section 14. In the region of joints 21, 22, the terminal sections 11, 12 of the HTS tape 10 and the terminal sections 31a, 32a of the follow-on superconductors 31, 32 are wound one above the other onto the coil former 2 in joint winding chambers 23a, 23b.

A second lateral region SB2 adjoins the main region HB axially below it, an intermediate joint 16 being formed in this second lateral region. Due to its lower position in the embodiment shown, the intermediate joint 16 is also referred to as a bottom-joint.

Connection grooves 17a, 17b for the HTS tape segments 10a, 10b in the coil former 2 lead from the main winding chamber 8 to the intermediate joint 16 where the HTS tape segments 10a, 10b are wound onto the coil former 2 in a groove 18 for the intermediate joint so as to lie one above the other and in electrically connected manner.

The solenoidal magnet section 1 fully utilizes a radial range RBS for the coil former 2, the HTS tape 10 and the follow-on superconductors 31, 32 at least in the region of the joints 21, 22 (that is, optionally without connecting regions of the follow-on superconductors 31, 32 that extend outward) in the radial direction as installation space, which range in this case extends from the smallest inner radius RiH of the coil former 2 in the main region HB (in the embodiment, the inner radius of the coil former 2 is the same everywhere) to the outer radius RT of the support shells 5a, 5b; these support shells 5a, 5b here are the parts of the coil former 2 that extend radially outward the most. The outer radius RT of the support shells 5a, 5b is slightly larger than the largest outer radius RaH of the main winding package 9 of the HTS tape 10, here being approximately RT=1.03*RaH.

The distancing of the joints 21, 22 and the intermediate joint 16 in the axial direction from the main winding package 9 can ensure that the strongest magnetic field Bjoint at these three joints 21, 22, 16 is significantly less than the (homogeneous) magnetic field B0 in the sample volume PV. In addition, by winding the HTS tape 10 onto the coil former 2 at these three joints 21, 22, 16, these joints 21, 22, 16 are accommodated in a particularly spatially compact manner, and these three joints 21, 22, 16 can be designed reliably and with practically negligible resistive losses by providing a large overlap length or overlap area.

The features of the solenoidal magnet section 1 are explained in more detail below with the aid of further figures which supplement FIG. 1 in more detail.

FIGS. 2a and 2b illustrate the joints 21, 22 in more detail. In the region of the upper, first joint 21, the terminal section 31a of the first follow-on superconductor 31 is wound radially inside onto the insulating member 4 (which is essentially designed as a plastics tube). A connecting section 31b of the first follow-on superconductor 31 leads away in the axial direction, an exit groove 19a being formed in the coil former 2 for this purpose. A part of the first terminal section 11 of the HTS tape 10, here radially outside, is wound onto the first follow-on superconductor 31 and connected to it electrically conductively (preferably superconductively), in a laminar manner. The overlap length corresponds to approx. 3-4 turns of HTS tape. A circumferential recess in the insulating member 4 serves as the joint winding chamber 23a (this can be seen better in FIG. 1) in which the wound first terminal section 11 of the HTS tape 10 and the wound terminal section 31a of the first follow-on superconductor 31 are accommodated. Since the insulating member 4 is made of an electrically insulating material, such as plastics material, the walls of the joint winding chamber 23a are electrically insulating.

A connecting section 32b of the second follow-on superconductor 32 passes radially inside the first joint 21 and the joint winding chamber 23a in an exit groove 19b.

The terminal section 32a of the second follow-on superconductor 32 is also wound onto the insulating member 4. The connecting section 32b of the second follow-on superconductor 32 leads away axially upward. A part of the second terminal section 12 of the HTS tape 10, here in turn radially outside, is wound onto the second follow-on superconductor 32 and connected to it electrically conductively (preferably superconductively), in a laminar manner. The overlap length corresponds here to about 3-4 turns of HTS tape. A circumferential recess in the insulating member 4 serves as the joint winding chamber 23b (this can be seen better in FIG. 1) in which the wound second terminal section 12 of the HTS tape 10 and the wound terminal section 32a of the second follow-on superconductor 32 are accommodated. The joint winding chamber 23b, machined into the insulating member 4, in turn has electrically insulating walls.

The first terminal section 11 of the HTS tape 10 passes radially inside the second joint 22 and the joint winding chamber 23b in a groove 24 (see also FIG. 1).

FIGS. 3a to 3d illustrate the entering and exiting of the terminal sections 11, 12 of the HTS tape 10 into the main winding package 9 in the main winding chamber 8 in more detail. The first terminal section 11 enters the radially innermost ("bottom-most") layer 26 and the second terminal section 12 exits from the radially outermost ("top-most") layer 27 (note that only a few turns of the innermost layer 26 and the outermost layer 27 are shown). The two terminal sections 11, 12 are guided in the coil former 2 in the grooves 15a, 15b.

At intersections 25 which are sufficiently axially distant from the main winding chamber 8, the radially outer terminal section (here the second terminal section 12 in groove 15b) may be easily guided over groove 15a for the radially inner terminal section (here the first terminal section 11) which lies below it in the main body 3 of the coil former 2. The groove depths of the two grooves 15a, 15b are simply selected to be different. The terminal sections 11, 12 preferably lie one above the other in the intersection 25; but even if they do not, the small area of the intersection 25 available for the mechanical solidity of the terminal sections 11, 12 is unproblematic.

However, if an intersection is so close to the main winding chamber 8 that the intersection is extended over a larger area due to the still slight pitch (pitch length) of the grooves 15a, 15b (in particular if the region extends over substantial parts of the circumference, for example over more than ½ of the circumference), the terminal sections 11, 12 might no longer be guided in a mechanically stable manner in the main body 3; radial contact would not be possible since, starting from the main winding chamber 8, the (helix) radius of the HTS tape 10 may only be changed gradually, in particular in order not to introduce bends about the short edge of the HTS tape.

Therefore, a set 5 of support shells 5a, 5b is arranged on the main body 3, which provides support for the radially outer terminal section 12 of the HTS tape 10; the set 5 is placed onto the main body 3 of the coil former 2, and typically also screwed thereon. The groove 15b for the radially outer terminal section 12 continues, starting from the main body 3, in the set 5 of support shells 5a, 5b and up to the radially outermost layer 27 of the main winding package 9. The groove 15a for the radially inner terminal section 11 runs from the main body 3 below the set 5 of support shells 5a, 5b (see also FIG. 1).

In the embodiment shown, the set 5 of support shells 5a, 5b consists of two support shells 5a, 5b ("half shells"), each covering approximately 180° of the circumference. The support shells 5a, 5b are made of electrically insulating plastics material.

FIGS. 4a to 4d illustrate the design of the intermediate joint 16 of the solenoidal magnet section of FIG. 1 in more detail.

If a length of the HTS tape 10 is to be installed in the solenoidal magnet section, which length is larger than it is possible to produce defect-free HTS tape pieces (for example in order to generate particularly strong magnetic fields), two HTS segments 10a, 10b may be connected to one another, the sections together forming the HTS tape 10 of the solenoidal magnet section. Typically, the HTS segments 10a, 10b exit two middle layers of the main winding package 9. To avoid complex intersections, typically only one intermediate joint 16 is put in place (as shown here); however, it is also fundamentally possible to put a plurality of intermediate joints in place.

Starting from the main winding chamber 8, which is bounded at the bottom by a set 6 of flange shells 6a, 6b (only shown in FIG. 1) for mechanical guidance, a connection groove 17b for the radially inner HTS tape segment 10a and a connection groove 17a for the radially outer HTS tape segment 10b lead from the main winding chamber 8 in the second lateral region SB2 to the intermediate joint 16. The connection grooves 17a, 17b intersect each other multiple times here. The connection grooves 17a, 17b run helically, the pitch length increasing axially outward (here downward) initially and then decreasing again near the intermediate joint 16.

The intermediate joint 16 is established here by means of direct laminar connection of the overlapping HTS tape segments 10a, 10b; the HTS tape 10 runs in this region as a "double tape" 28 (alternatively, a sc bridge tape can also be provided which overlaps the HTS tape segments 10a, 10b, but this is not shown).

The double tape 28 is wound in two layers onto the coil former 2. A radially inner layer of the double tape 28 is wound directly onto the main body 3; for this purpose, the main body 3 forms a groove 18 for the intermediate joint with a radially inner part 18a in which the double tape 28 is guided. A radially outer layer of the double tape 28 is formed on a set 7 of detachable half-shells 7a, 7b which is placed on the main body 3. The set 7 of detachable half-shells 7a, 7b contains the radially outer part 18b of the groove 18 for the intermediate joint. At the axially outer end of the set 7 of detachable half-shells 7a, 7b, a region for a radial transition 29 is formed, in which region the groove 18 for the intermediate joint increases in radius at the inner part 18a in the direction of a transition groove 30, and decreases in radius at the outer part 18b in the direction of the transition groove 30. The double tape 28 is thus guided once out in the axial direction and then back in using the two layers. As a result, an overlap length sufficient for good electrical contact may be easily provided.

In the embodiment shown, the set 7 of detachable half-shells 7a, 7b consists of two detachable half-shells 7a, 7b ("half shells"), each covering approximately 180° of the circumference. The detachable half-shells 7a, 7b are made of electrically insulating plastics material.

Figure 5:
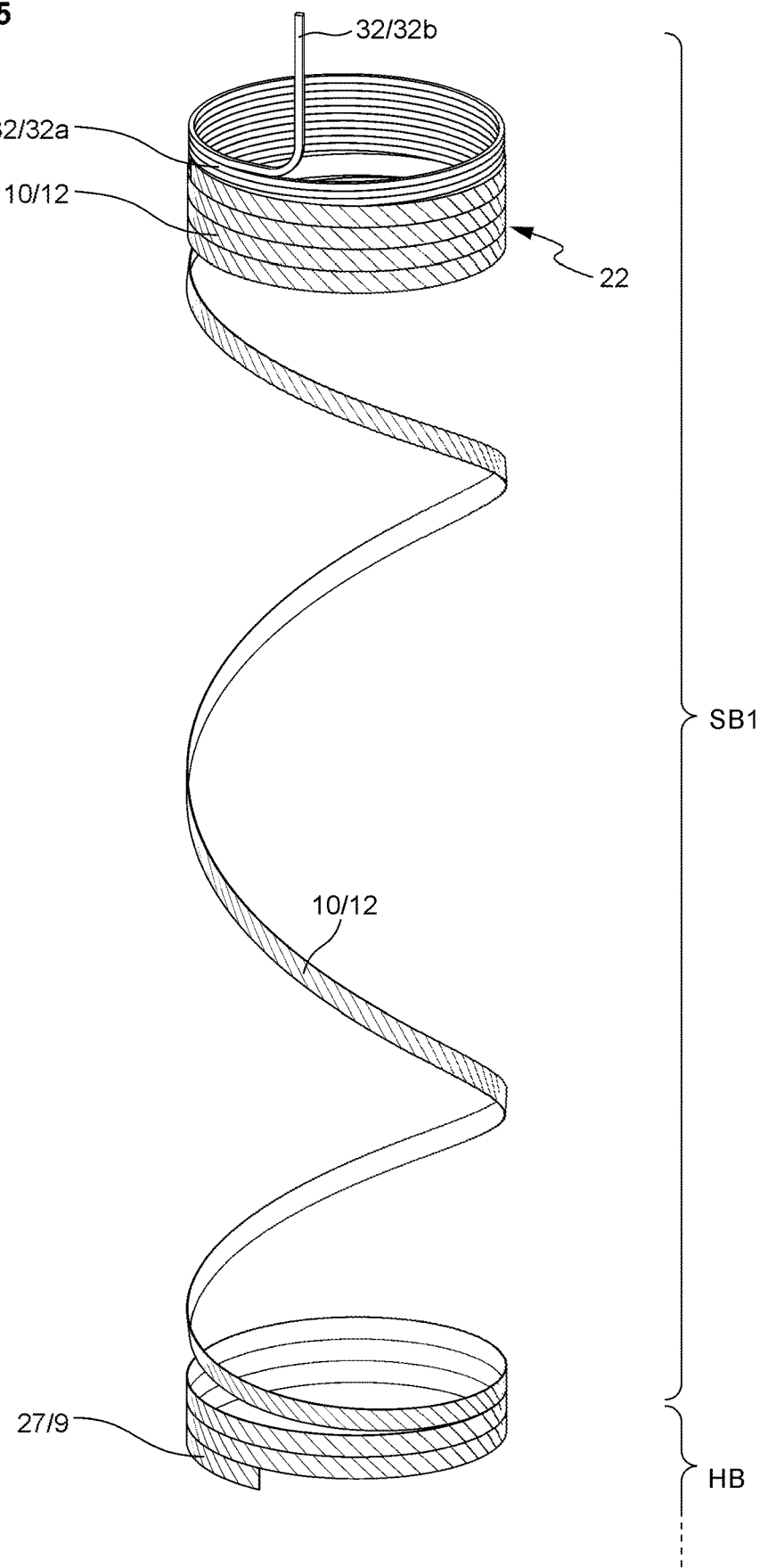
FIG. 5 shows a schematic perspective view of the solenoidal magnet section of FIG. 1, in the region from the main winding package to the first joint, and only with the first terminal section of the HTS tape.

FIG. 5 illustrates the course of a terminal section (shown here using the example of the second terminal section 12) of the HTS tape 10 from the main winding package 9 to the joint (here the second joint 22).

In the embodiment shown, the terminal section 12 and its part associated with the second joint 22 is wound helically and flat onto the coil former (not shown) with windings that are directly axially adjacent to one another; the pitch length there is minimal and essentially determined by the width of the HTS tape 10 and the winding radius. The pitch length then initially increases axially inward (downward) to the main winding package 9 in order to make do with the shortest possible tape length in this transition. Note that the HTS tape 10 outside the main winding package 9 may affect the homogeneity of the magnetic field generated in the sample volume. The pitch length of the helical winding then decreases again until it is finally minimal in the region of the main winding package, essentially determined by the tape width and the winding radius, since the turns in the main winding package 9 again lie flat and axially directly against one another.

In general, the course of an HTS tape 10 (approximately that of the terminal section 11, 12 of the tape) is determined by an associated guide in the coil former 2 (by a groove 15a, 15b, for example). The mechanical load, in particular bending about the short side of the HTS tape 10, may be minimized by a suitable course of the guide and in particular a suitable orientation of a groove bottom 33 (not depicted in FIG. 5, but see FIG. 1), and the orientation of the HTS tape 10 may also be optimized with respect to the local magnetic field. The local surface normal FN of the groove bottom 33 can be at an angle α other than 90° relative to the axis A of the coil former 2. The components of the magnetic field normal to the tape surface significantly impair the current carrying capacity of the HTS tape 10. The local groove bottom 33 should therefore be aligned in such a way that the magnitude of the local normal component of the magnetic field is nowhere greater than a reference normal component reached in any case in the HTS tape 10 as the maximum value of a local normal component at the axial edge of the main winding package 9.

Figure 6:
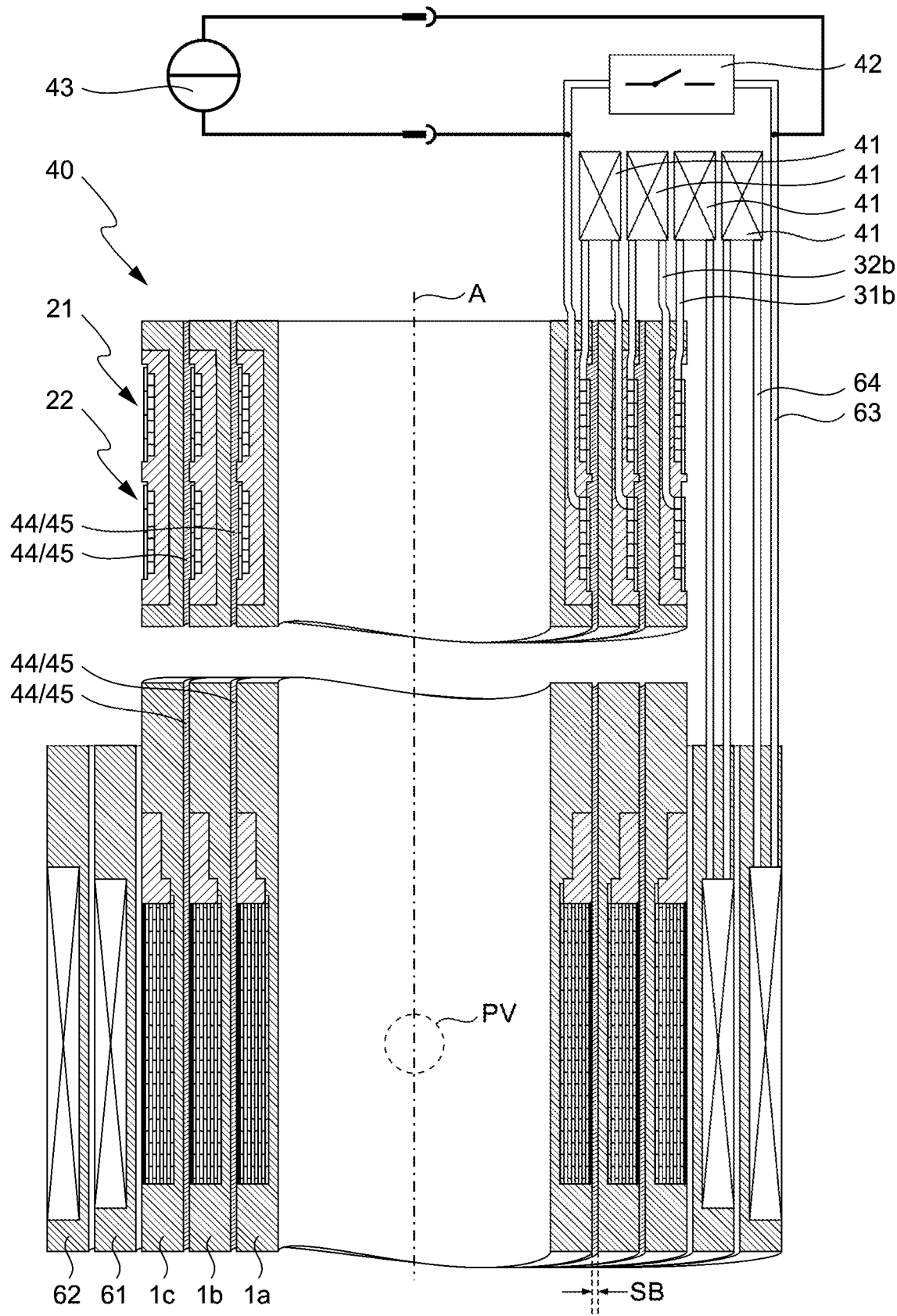
FIG. 6 shows a highly schematic longitudinal section through an embodiment of a magnet coil assembly according to the invention, comprising a plurality of solenoidal magnet sections inserted one inside the other.

FIG. 6 shows an embodiment of a magnet coil assembly 40 according to the invention. It comprises three solenoidal magnet sections 1a, 1b, 1c inserted one inside the other and comprising HTS tapes, and integrated joints 21, 22 (as shown for example in FIG. 1-5) as well as two further solenoidal magnet sections 61, 62 inserted one inside the other, each containing a solenoidally wound LTS wire. The solenoidal magnet sections 1a-1c here are arranged inside of the further solenoidal magnet sections 61, 62. The magnet coil assembly 40 as a whole, that is to say the solenoidal magnet sections 1a, 1b, 1c and the further solenoidal magnet sections 61, 62 together, generates a homogeneous magnetic field in the sample volume PV.

The solenoidal magnet sections 1a-1c are of equal length in the axial direction (see axis A) and their lengths align. Here, the solenoidal magnet sections 1a-1c and the further solenoidal magnet sections 61, 62 are electrically connected in series with one another via the connecting sections 31b, 32b of the follow-on superconductors and the further connecting sections 63, 64, outer joints 41 being implemented here. In the embodiment shown, the magnet coil assembly 40 may be superconductively short-circuited via the superconducting switch 42, and thus switched into a persistent mode in which no external power supply is required and the magnetic field in the sample volume PV may be maintained permanently and with practically no drift. An electrical power source 43 is arranged here in parallel with the switch 42, it being possible to charge and discharge the magnet coil assembly 40 by means of the power source.

The gap 45 remaining between adjacent solenoidal magnet sections 1a, 1b or 1b, 1c has here been filled with an electrically insulating impregnation material 44, in this case a casting material in the hot state, the casting material hardening in the cold state and mechanically stabilizing the solenoidal magnet sections 1a-1c during operation. The radial gap width SB between adjacent solenoidal magnet sections 1a, 1b or 1b, 1c is typically a maximum of 0.6 mm (GSP≤0.60 mm) over the entire circumference and the entire axial length, and typically on average a maximum of 0.5 mm (MS≤0.50 mm).

Note that the solenoidal magnet sections 1a-1c, the further solenoidal magnet sections 61, 62, the connecting sections 31b, 32b, the further connecting sections 63, 64, the external joints 41 and the superconducting switch 42 are typically arranged inside of a cryostat within which a cryogenic temperature can be set (not shown in more detail).

Figure 7:
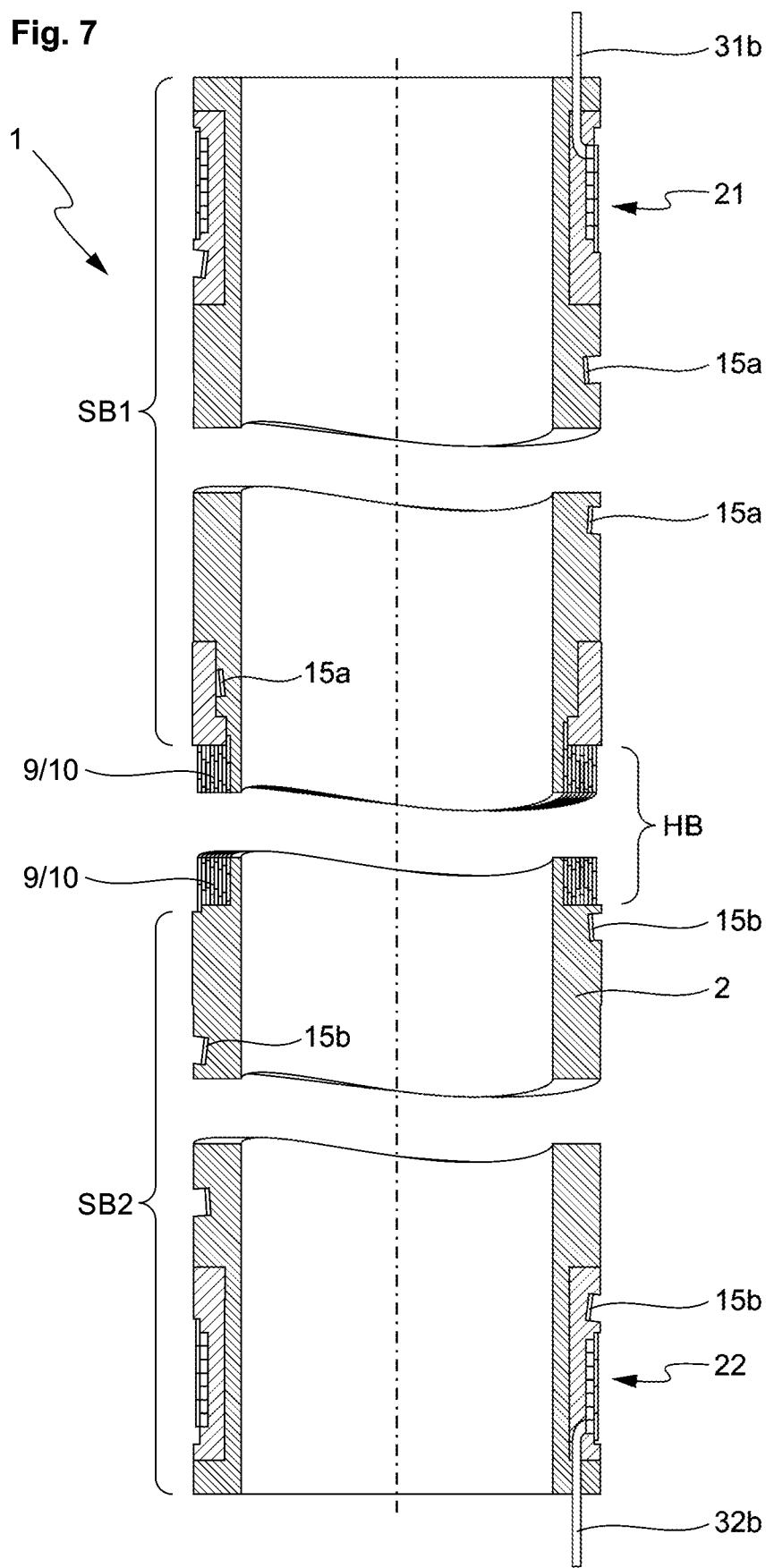
FIG. 7 shows a highly schematic longitudinal section through a further embodiment of a solenoidal magnet section according to the invention, with the first joint in the first lateral region and the second joint opposite thereto in the second lateral region.

FIG. 7 shows a further embodiment of a solenoidal magnet section 1 according to the invention, similar to the solenoidal magnet section presented in FIGS. 1 to 5. Only the main differences are explained. In this embodiment, the first joint 21 is arranged in the first lateral region SB1, and the second joint 22 is arranged opposite thereto in the second lateral region SB2. In this case, the two grooves 15a, 15b, which guide the HTS tape 10 from the main winding package 9 to the joints 21, 22, do not require any intersections. The connecting sections 31b, 32b of the follow-on superconductors are guided axially out from the coil former 2 at opposite sides here.

FIG. 8 shows a further embodiment of a solenoidal magnet section 1 according to the invention, similar to the solenoidal magnet section of FIG. 7, the section of FIG. 8 being limited to the first lateral region SB1 for simplification. Only the essential differences from FIG. 7 are explained.

The first joint 21 is formed in the first lateral region 1 (the second joint here is formed in the second lateral region, not shown; however, it should be noted that the structure of the first joint 21 shown can also be used analogously if the second joint is also formed in the first lateral region). The first joint 21 has a helical circumferential joint groove 81 in the coil former 2, in this case in an insulating member 4 made of electrically insulating material (for example plastics material), the member being seated on the main body 3 of the coil former 2 and the joint groove in this case having a total of five turns. A rib 82 of the coil former 2 that separates the turns remains between each of the turns. Due to the insulating material of the insulating member 4, the walls of the joint groove 81 are electrically insulating.

The first follow-on superconductor 31, rolled to the width of the HTS tape 10, is wound here radially inside in the joint groove 81. The first terminal section 11 of the HTS tape 10 is wound radially outside in the joint groove 81.

The rolled follow-on superconductor wire 31 and the HTS tape 10 therefore lie one on top of the other in the joint groove 81 and are electrically connected (preferably superconductively) in a laminar manner. Joint groove 81 can guide and mechanically stabilize the HTS tape 10 and the rolled follow-on superconductor 31 individually in each turn.

Here, the first joint 21 comprises five revolutions of the HTS tape 10 and the follow-on superconductor 31 around coil former 2. In the region of connecting section 31b of the follow-on superconductor 31, the follow-on superconductor 31 is not rolled wide, but rather has a rectangular cross section. The groove 15a guides the HTS tape 10 from the first joint 21 to the main winding package 9.

In summary, the present invention proposes a solenoidal magnet section (1; 1a-1c) in which a high-temperature-superconductor tape (HTS tape) (10) is wound in a solenoidal manner in a main winding chamber (8) of a coil former (2), and the solenoidal magnet section (1; 1a-1c) has a first joint (21) and a second joint (22), each from the HTS tape (10) to a particular follow-on superconductor (31, 32), the joints (21, 22) being integrated into the solenoidal magnet section (1; 1a-1c). The terminal section (11, 12) of the HTS tape (10) and the terminal section (31a, 32a) of the associated follow-on superconductor (31, 32) are wound onto the coil former (2) and connected to one another in a laminar manner in the region of the first joint (21) and of the second joint (22), typically a plurality of turns of the HTS tape (10) and of the follow-on superconductor (31, 32) overlapping. The joints (21, 22) are set at an axial distance away from the main winding chamber (8). The solenoidal magnet section (1; 1a-1c) occupies a radial range (RBS) that exceeds the outer radius (RaH) of the main winding package (9) of the HTS tape (10) by a maximum of 20% and is less than the inner radius (RiH) of the coil former (2) in the region of the main winding chamber (8). A plurality of solenoidal magnet sections can be inserted one inside the other to form a magnet coil assembly. With the solenoidal magnet section according to the invention, a simple and compact structure and a high superconducting current carrying capacity are possible.

The invention claimed is:

1. A solenoidal magnet section
    comprising a cylindrical coil former, a high-temperature-superconductor tape (HTS tape) and a first follow-on superconductor with a first joint between the HTS tape and the first follow-on superconductor,
    the coil former having a main region in which a main winding package of the HTS tape is wound in a solenoidal manner onto the coil former,
    the coil former also having a first lateral region which axially adjoins the main region on a first side and in which a first terminal section of the HTS tape is wound onto the coil former,
    the first terminal section of the HTS tape being guided in a groove on the surface of the coil former at least in an axially inner section of the first lateral region, and the main winding package of the HTS tape having a largest outer radius RaH, and the coil former having a smallest inner radius RiH in the main region,
    wherein:
        the solenoidal magnet section further comprises a second follow-on superconductor with a second joint to the HTS tape,
        in the first lateral region or in a second lateral region which axially adjoins the main region on a second side and lies opposite to the first side, a second terminal section of the HTS tape is wound onto the coil former,
        at least in an axially inner section of the first or the second lateral region, the second terminal section of the HTS tape is guided in a groove in the coil former,
        in an axially outer section of the first lateral region at least a part of the first terminal section of the HTS tape wound onto the coil former is connected in a laminar manner to a terminal section of the first follow-on superconductor to form the first joint and at least a part of the second terminal section of the HTS tape wound onto the coil former is connected in a laminar manner to a terminal section of the second follow-on superconductor to form the second joint, and the coil former, the HTS tape, and the first follow-on superconductor, at least in the region of the first joint, and the second follow-on superconductor, at least in the region of the second joint, run within a radial range RBS of the solenoidal magnet section, where $0.80*\text{RiH} \leq \text{RBS} \leq 1.2*\text{RaH}$.

2. The solenoidal magnet section according to claim 1, wherein in the axially outer section of the first lateral region, the coil former has a circumferential recess as a first joint winding chamber in which at least the part of the first terminal section of the HTS tape with a plurality of adjacent turns and the terminal section of the first follow-on superconductor with a plurality of adjacent turns are wound so as to lie one above the other, and in the axially outer section of the first or the second lateral region, the coil former has a circumferential recess as a second joint winding chamber in which at least the part of the second terminal section of the HTS tape with a plurality of adjacent turns and the terminal section of the second follow-on superconductor with a plurality of adjacent turns are wound so as to lie one above the other.

3. The solenoidal magnet section according to claim 2, wherein the coil former is made of an electrically insulating material in the region of the walls of the first joint winding chamber and/or of the walls of the second joint winding chamber.

4. The solenoidal magnet section according to claim 1, wherein the coil former has a first joint groove in the axially outer section of the first lateral region, which groove passes at least once around the coil former and in which at least the part of the first terminal section of the HTS tape and the terminal section of the first follow-on superconductor are guided so as to lie one above the other, and in the axially outer section of the first or the second lateral region, the coil former has a second joint groove which passes at least once, preferably several times, around the coil former, in which groove at least the part of the second terminal section of the HTS tape and the terminal section of the second follow-on superconductor are guided so as to lie one above the other.

5. The solenoidal magnet section according to claim 4, wherein the coil former is made of an electrically insulating material in the region of the walls of the first joint groove and/or of the walls of the second joint groove.

6. The solenoidal magnet section according to claim 1, wherein the second terminal section of the HTS tape is also wound onto the coil former in the first lateral region, the grooves of the first terminal section and of the second terminal section intersecting multiple times in the axially inner section of the first lateral region.

7. The solenoidal magnet section according to claim 6, wherein in a transition region of the axially inner section of the first lateral region axially adjoining the main winding chamber, the coil former is formed with a set of support shells which sit on the rest of the coil former and together annularly surround the rest of the coil former, and in the transition region one of the grooves is formed in the set of support shells for the first terminal section and the second terminal section of the HTS tape, and the other of the grooves is formed in the rest of the coil former radially below the set of support shells for the first terminal section and the second terminal section of the HTS tape, the first and the second terminal section of the HTS tape intersecting at least once in the transition region.

8. The solenoidal magnet section according to claim 6, wherein in the axially inner section of the first lateral region, the grooves for the first terminal section and the second terminal section of the HTS tape are formed with a different groove depth in at least one intersection of the grooves.

9. The solenoidal magnet section according to claim 6, wherein in the axially outer section of the first lateral region, a groove for the terminal section of the HTS tape which comprises the joint lying axially further outside runs radially inside the joint lying axially further inside.

10. The solenoidal magnet section according to claim 6, wherein in the axially outer section of the first lateral region, an exit groove for the follow-on superconductor which is part of the joint lying axially further inside runs radially inside the joint lying axially further outside.

11. The solenoidal magnet section according to claim 1, wherein the HTS tape has at least two HTS tape segments which are serially connected to one another conductively via at least one intermediate joint, the HTS tape segments being wound onto the coil former in the region of the at least one intermediate joint in the first lateral region or in the second lateral region, and being connected to a common superconducting (sc) bridge tape in the region of the at least one intermediate joint.

12. The solenoidal magnet section according to claim 11, wherein the coil former forms two connection grooves for the HTS tape segments in the first lateral region or in the second lateral region, which connection grooves lead from the main winding chamber to the region of the at least one intermediate joint, and the coil former forms a groove for the intermediate joint for the HTS tape segments in the region of the intermediate joint.

13. The solenoidal magnet section according to claim 12, wherein in the region of the at least one intermediate joint the coil former is formed with a set of detachable half-shells which sit on the rest of the coil former and together annularly surround the rest of the coil former, and a radially outer part of the groove for the intermediate joint is formed in the set of detachable half-shells, and a radially inner part of the groove for the intermediate joint is formed radially below the set of detachable half-shells in the rest of the coil former, the set of detachable half-shells having a region for the radial transition of the intermediate joint.

14. The solenoidal magnet section according to claim 11, wherein the second terminal section of the HTS tape is also wound onto the coil former in the first lateral region, and the HTS tape segments in the region of the at least one intermediate joint are wound onto the coil former in the second lateral region, the cylindrical axis of the coil former being aligned vertically with the second lateral region of the coil former at the bottom and the first lateral region at the top.

15. The solenoidal magnet section according to claim 1, wherein at least one of the grooves in which the HTS tape is guided at least in the axially inner section of the first and/or the second lateral region, joint grooves in which the first and/or the second terminal section of the HTS tape are guided in the axially outer section of the first and/or the second lateral region, and connection grooves and grooves for the intermediate joint for HTS tape segments of the HTS tape which are connected to an intermediate joint, are formed at least in part with a groove bottom on which the HTS tape rests and local surface normal of which is at an angle other than 90° relative to the axis of the coil former.

16. A magnet coil assembly comprising a plurality of solenoidal magnet sections arranged so as to be inserted in sequence, at least one of the solenoidal magnet sections being designed according to claim 15, wherein for a gap width MS of a particular radial gap between adjacent solenoidal magnet sections, averaged over the entire circumference, MS≤1 mm, and the solenoidal magnet sections are electrically connected in series, and the local surface normal of the groove bottom runs in such a way that:

bending about the short edge of the HTS tape lying on the groove bottom is so small that elongation of the HTS tape never exceeds 0.6% at its edges, and a local normal component of a magnetic field generated overall by the magnet coil assembly, which component is parallel to the local surface normal of the groove bottom, is smaller than or equal in magnitude overall to a reference normal component of the magnetic field, which reference normal component is the maximum of all components normal to the local tape surfaces of the HTS tape at the axially outermost turns of the main winding package.

17. A magnet coil assembly comprising a plurality of solenoidal magnet sections according to claim 1, the solenoidal magnet sections being arranged so as to be inserted in sequence and, for a gap width MS of a particular radial gap between adjacent solenoidal magnet sections, averaged over the entire circumference, MS≤1 mm.

18. The magnet coil assembly according to claim 17, wherein the main winding package of a particular radially inner solenoidal magnet section rests radially outward against an inside of the coil former of the radially next outer solenoidal magnet section, and a particular radial gap between adjacent solenoidal magnet sections is filled with an impregnation material, the impregnation material being electrically insulating, and comprising a cured casting material and/or films.

19. The magnet coil assembly according to claim 17, wherein the solenoidal magnet sections are formed with an identical axial length of the coil former and the coil formers are axially aligned.

20. The magnet coil assembly according to claim 17, wherein the solenoidal magnet sections are conductively connected to one another via their first follow-on superconductors and second follow-on superconductors.

21. The magnet coil assembly according to claim 17, wherein the magnet coil assembly is designed to generate a magnetic field with a strength B0 and a homogeneity of 100 ppm or better in a sample volume of at least 0.5 cm$^3$ inside the innermost solenoidal magnet section, and wherein the first joints and the second joints of the solenoidal magnet sections are axially distanced far enough from the sample volume that, for the magnitude of the strongest magnetic field Bjoint at each of these joints, Bjoint≤½*B0.

22. The solenoidal magnet section according to claim 1, wherein the first joint and the second joint each extend over the entire circumference of the coil former, and/or the first joint and the second joint each extend over an overlap length, relative to the HTS tape, of at least 0.1 m.

23. The solenoidal magnet section according to claim 1, wherein in the main region the coil former has a circumferential recess as the main winding chamber, in which the main winding package of the HTS tape is layer-wound into a solenoid.

24. The solenoidal magnet section according to claim 1, wherein the first follow-on superconductor and/or the second follow-on superconductor contain at least one of a low-temperature-superconductor material (LTS material) and $MgB_2$, and the HTS tape contains ReBCO.

25. The solenoidal magnet section according to claim 1, wherein in the first lateral region the HTS tape of the first terminal section is helically wound, and in the first or the second lateral region the HTS tape of the second terminal section is helically wound, each with a pitch length that initially increases axially outward and then decreases again.

26. The solenoidal magnet section according to claim 1, wherein a particular connecting section of the first follow-on superconductor and of the second follow-on superconductor leads in each case axially away from the axially outer section of the first or the second lateral region.

* * * * *